United States Patent [19]

Kitamura

[11] Patent Number: 5,517,042
[45] Date of Patent: May 14, 1996

[54] SEMICONDUCTOR DEVICE HAVING MULTI-LEVEL WIRING STRUCTURE

[75] Inventor: Mamoru Kitamura, Tokyo, Japan

[73] Assignee: NEC Corporation, Japan

[21] Appl. No.: 354,556

[22] Filed: Dec. 13, 1994

[30] Foreign Application Priority Data

Dec. 15, 1993 [JP] Japan ................................. 5-3146257

[51] Int. Cl.⁶ ........................................................ H01L 27/10
[52] U.S. Cl. ......................... 257/207; 257/691; 257/758
[58] Field of Search ................................. 257/691, 207, 257/206, 210, 211, 208, 758

[56] References Cited

U.S. PATENT DOCUMENTS

| | | | |
|---|---|---|---|
| 4,947,229 | 8/1990 | Tanaka et al. | 257/207 |
| 5,038,192 | 8/1991 | Bonneau et al. | 257/206 |
| 5,386,129 | 9/1992 | Koizumi | 257/691 |

FOREIGN PATENT DOCUMENTS 2284229  11/1990  Japan ............................. H01L 21/88

*Primary Examiner*—William Mintel
*Assistant Examiner*—Roy Potter
*Attorney, Agent, or Firm*—Hayes, Soloway, Hennessey, Grossman & Hage

[57] ABSTRACT

A semiconductor device according to the invention includes a first layer including first and second device regions, in which semiconductor devices are formed; and a second layer including a signal line region, a first power supply region, which is one selected between power source and ground and a second power supply region which is the remaining of the power source and ground, the second power supply region being horizontally positioned between the signal line and first power supply regions. The first device region is positioned under both said first and second power supply regions. The second device region is positioned under the signal line region and the second power supply region.

17 Claims, 8 Drawing Sheets

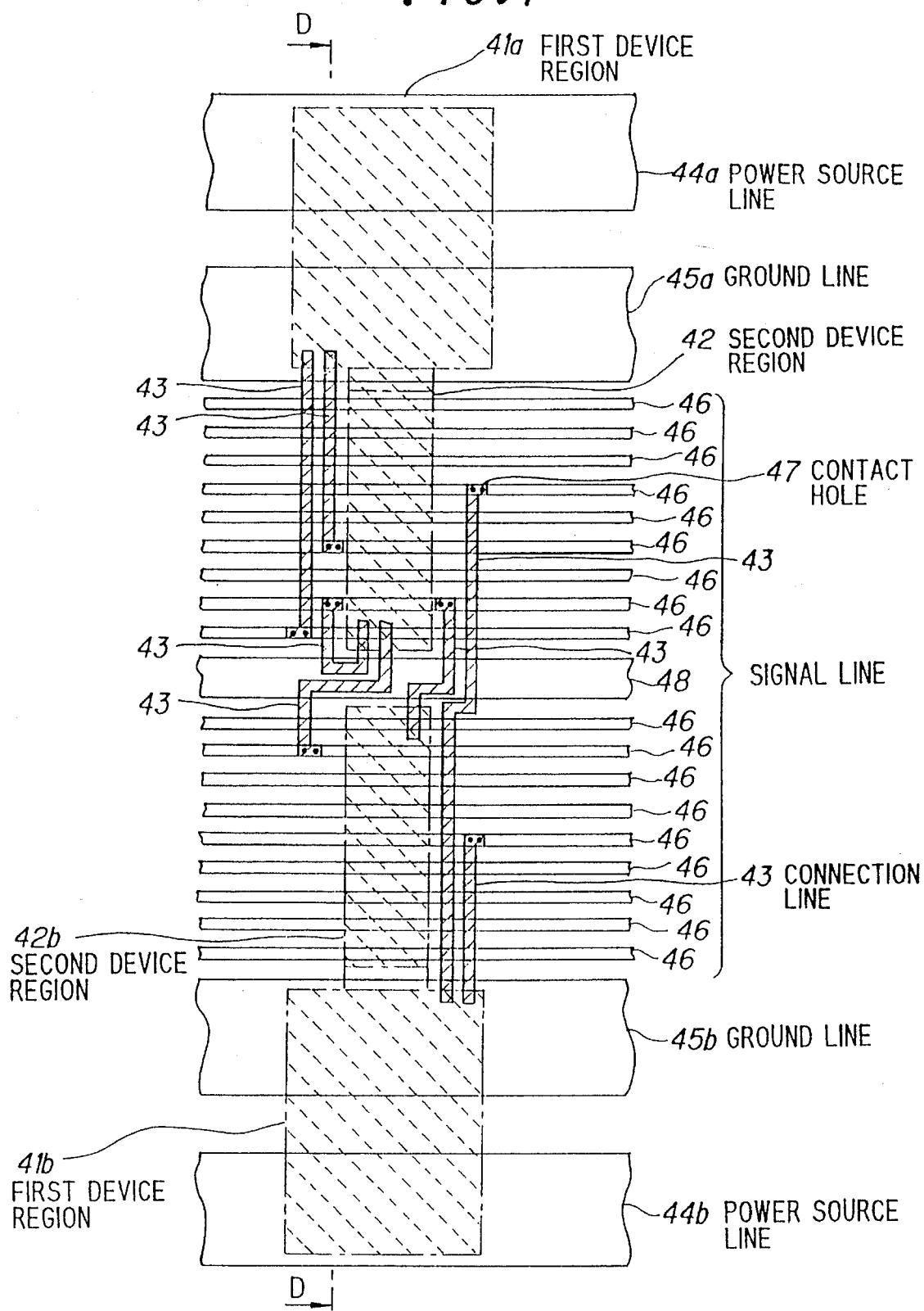

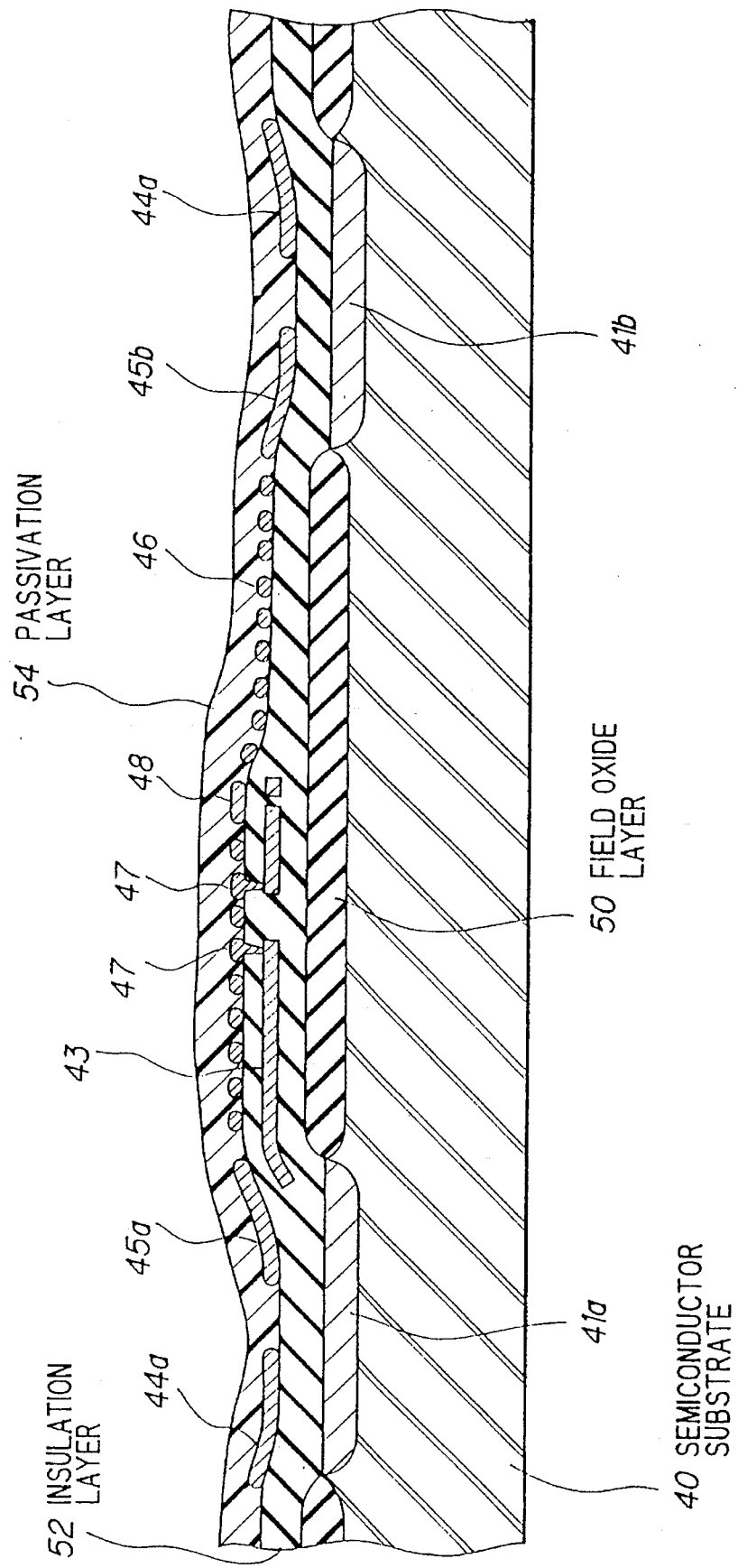

SEMICONDUCTOR DEVICE HAVING MULTI-LEVEL WIRING STRUCTURE

FIELD OF THE INVENTION

The invention relates to a semiconductor device, especially to a multilayer semiconductor device in which device regions are formed under a power supply line area and a signal line area.

BACKGROUND OF THE INVENTION

A conventional multilayer semiconductor device uses Bus-Line system of arrangement, in which a device region and a signal line region are arranged separately. In response to improvement of integration of ICs, another type of conventional multilayer semiconductor device including a device block located under a signal line region has been proposed.

A Japanese Patent Publication, Kokai Heisei 2-284229, describes a bus-line type of semiconductor memory in which same phase of signal lines are arranged together to be a bunch so that next two signal lines in a bunch are arranged with a small space from each other but next two bunches are arranged with a large space from each other. This kind of arrangement can prevent a semiconductor circuit, to be mounted in the device, from misoperating.

SUMMARY OF THE INVENTION

Accordingly, an object of the invention is to provide an improved semiconductor device which can be miniaturized well.

According to an aspect of the invention, a semiconductor device includes a first layer including first and second device regions, in which semiconductor devices are formed; and a second layer including a signal line region, a first power supply region, which is one selected between power source and ground, and a second power supply region which is the remaining of the power source and ground, the second power supply region being horizontally positioned between the signal line and first power supply regions. The first device region is positioned under both the first and second power supply regions. The second device region is positioned under the signal line region and the second power supply region.

According to another aspect of the invention, an additional power supply line is arranged in the signal line region to supply stable electric power to the second device region.

BRIEF DESCRIPTION OF THE DRAWINGS

FIG. 7 is a plane illustrating the arrangement of a semiconductor device of a third preferred embodiment according to the invention.

FIG. 8 is a cross-sectional view taken on line D—D in FIG. 7.

DESCRIPTION OF THE PREFERRED EMBODIMENTS

Figure 1:
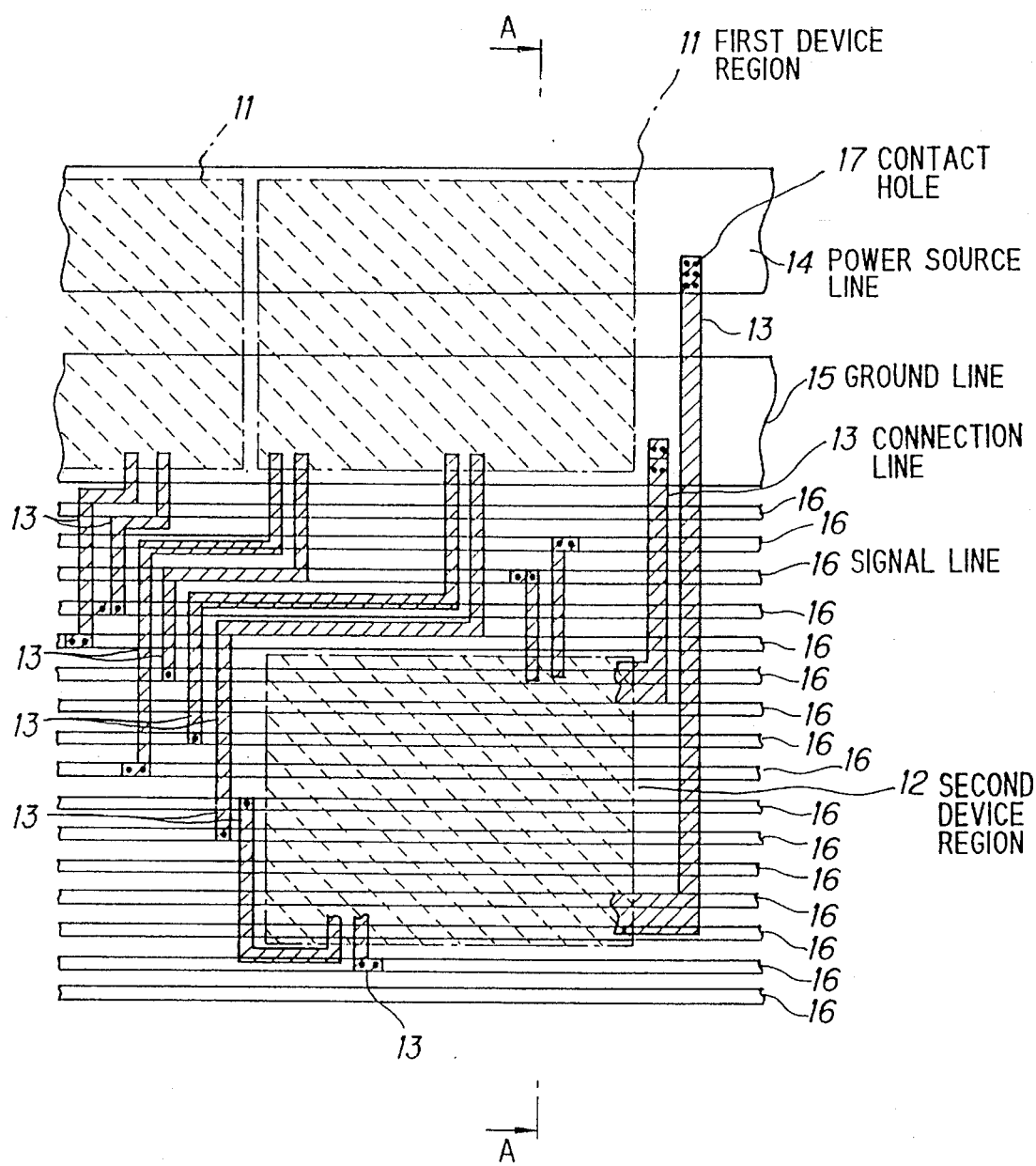
FIG. 1 a plane view illustrating the arrangement of a conventional semiconductor device.
Figure 2:
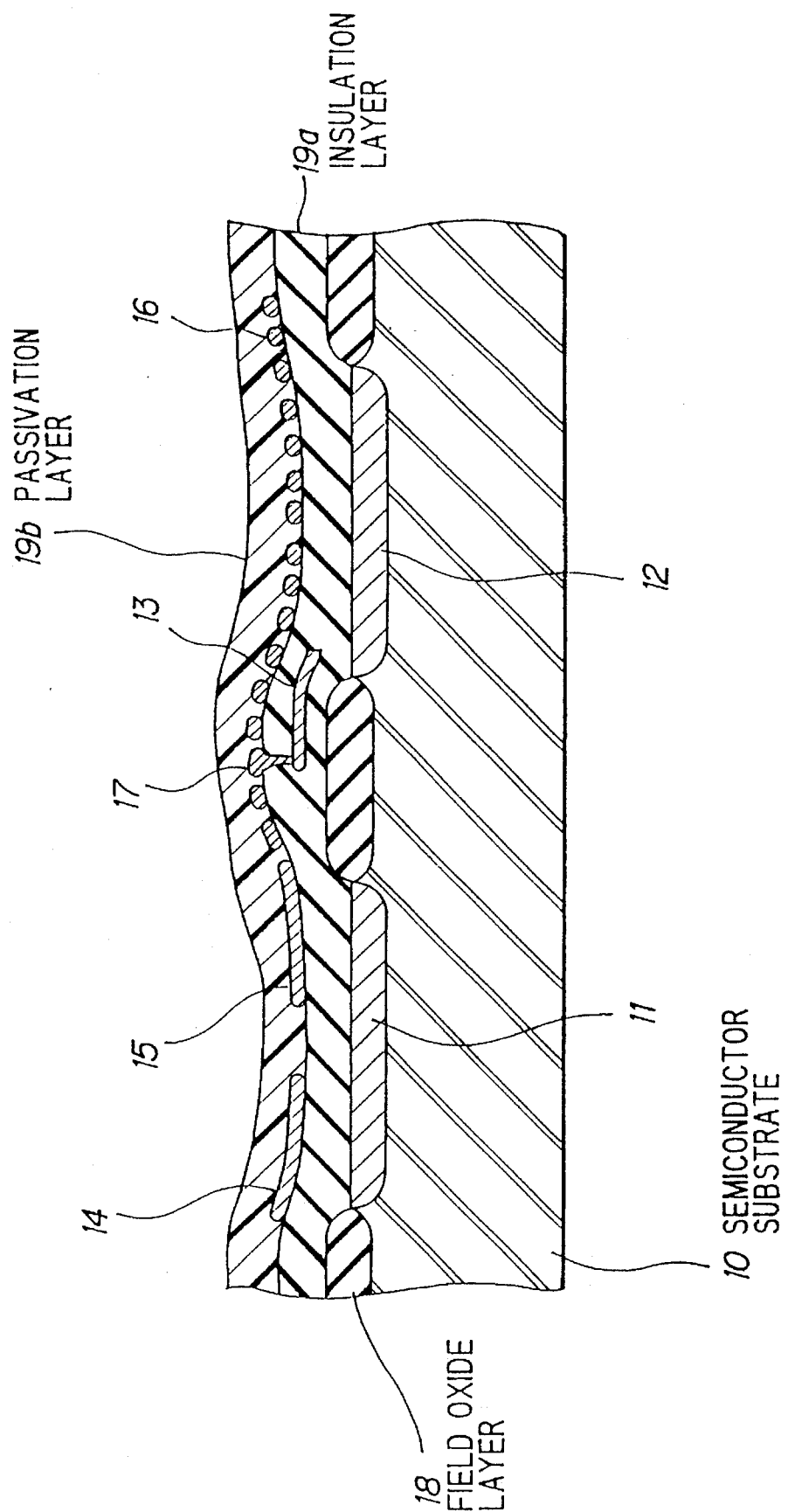
FIG. 2 is a cross-sectional view taken on line A—A in FIG.

For better understanding of the invention, a conventional technology is first described. FIGS. 1 and 2 show a conventional semiconductor device, including a semiconductor substrate 10, first and second device regions 11 and 12 formed on the semiconductor substrate 10, a field oxide layer 18, an insulation layer 19a, a passivation layer 19b, a power source line 14, a ground line 15, signal lines 16, connection lines 13 for connecting the power source line 14 and the ground line 15 to the second device region 12, and contact holes 17 for connecting the connection lines 13 to the signal lines 16, the power source line 14 and the ground line 15.

The first and second device regions 11 and 12 are separated by the field oxide layer 18. The first device region 11 is arranged under both the power source line 14 and the ground line 15 so that stable electric power can be supplied to the first device region 11. On the other hand, the second device region 12 is connected to the power source line 14 and the ground line 15 via the connection lines 13 and the contact holes 17.

Figure 3:
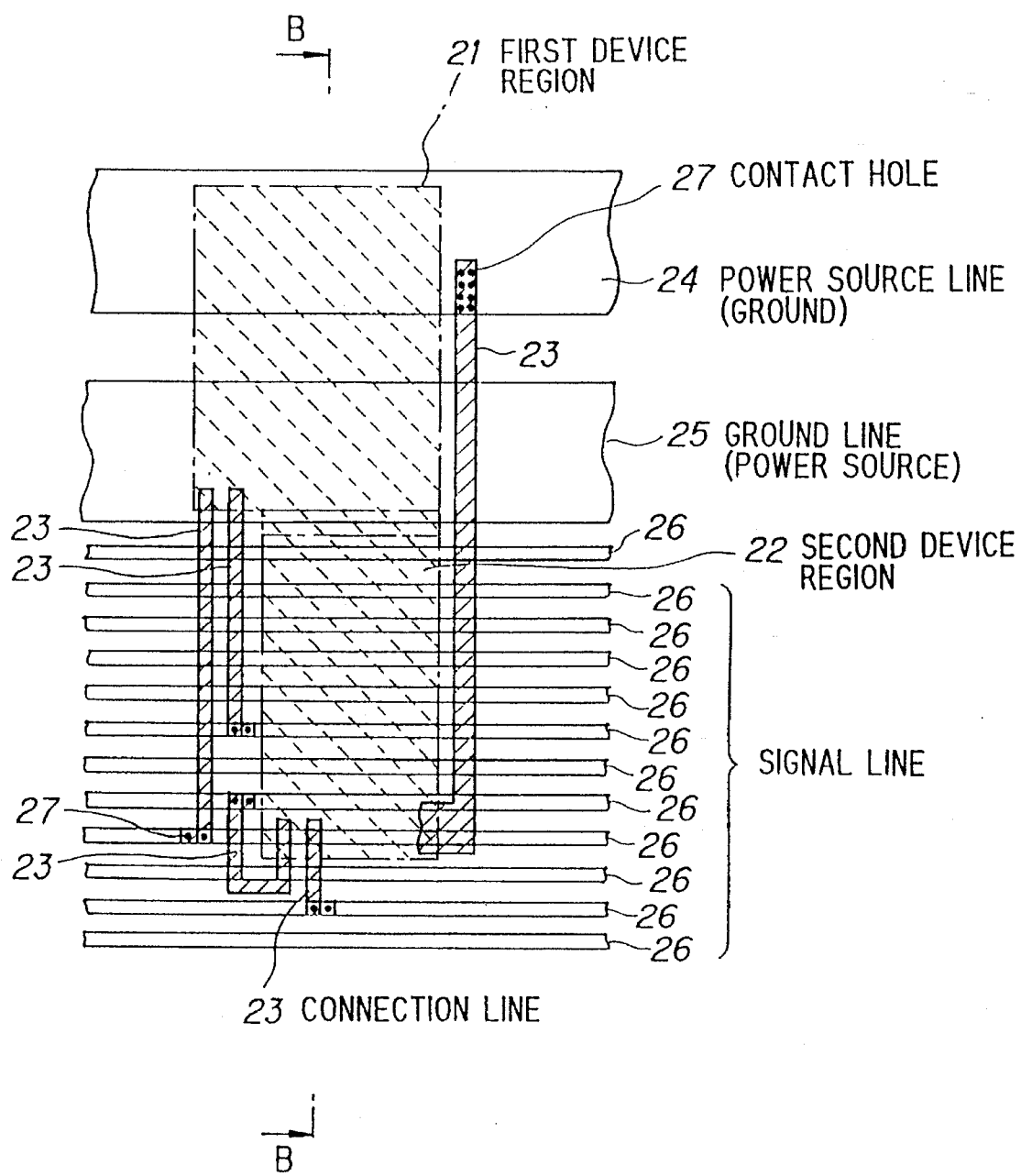
FIG. 3 is a plane view illustrating the arrangement of a semiconductor device of a first preferred embodiment according to the invention
Figure 4:
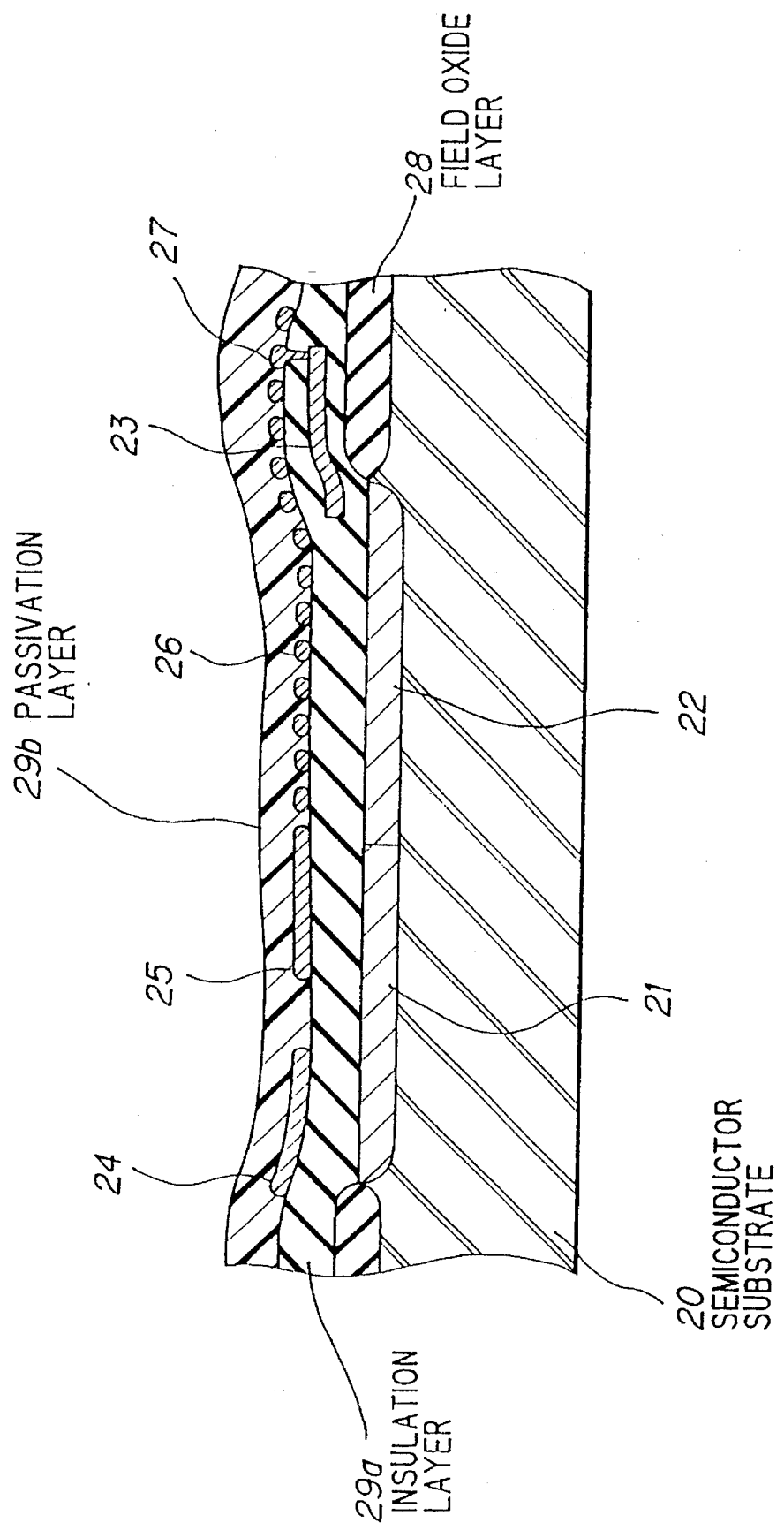
FIG. 4 is cross-sectional view taken on line B—B in FIG. 3.

FIGS. 3 and 4 show a semiconductor device of a first preferred embodiment according to the invention, including a semiconductor substrate 20, first and second device regions 21 and 22 formed on the semiconductor substrate 20, a field oxide layer 28, an insulation layer 29a, a passivation layer 29b, a power source line 24, a ground line 25, signal lines 26, connection lines 23 for connecting the power source line 24 to the second device region 22, and contact holes 27 for connecting the connection lines 23 to the signal lines 26 and the power source line 24.

The first and second device regions 21 and 22 are formed by separating a single device block so that the first device region 21 is designed larger than the second device region 22. In the first and second device regions 21 and 22, a larger device for driving a large number of element and a smaller device, such as a delay circuit are to be mounted, respectively.

The first device region 21 is arranged under both the power source line 24 and the ground line 25 so that stable electric power/ground level voltage can be supplied thereto directly. On the other hand, the second device region 22 is arranged under the signal lines 26 and the ground line 25 so that stable ground level voltage can be supplied thereto directly. Power source is provided from the power source line 24 through the connection line 23 and the contact hole 27 to the second device region 22.

At ends of the first and second device regions 21 and 22, which face each other, the same conductive type (P or N) of semiconductor elements are to be arranged. In this embodiment, other device blocks may be arranged next to each of the first and second device regions 21 and 22.

Figure 5:
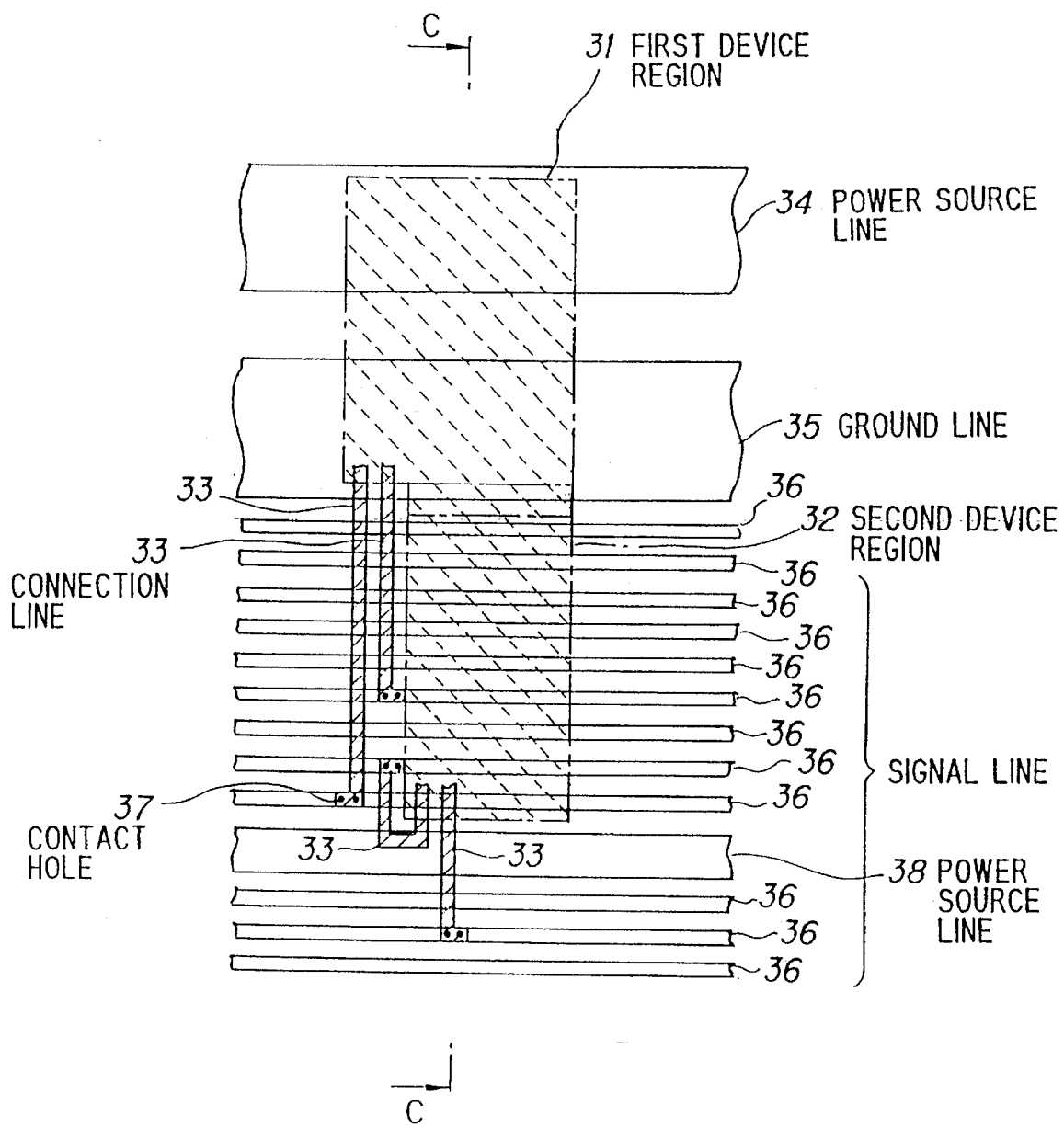
FIG. 5 is a plane view illustrating the arrangement of a semiconductor device of a second preferred embodiment according to the invention.
Figure 6:
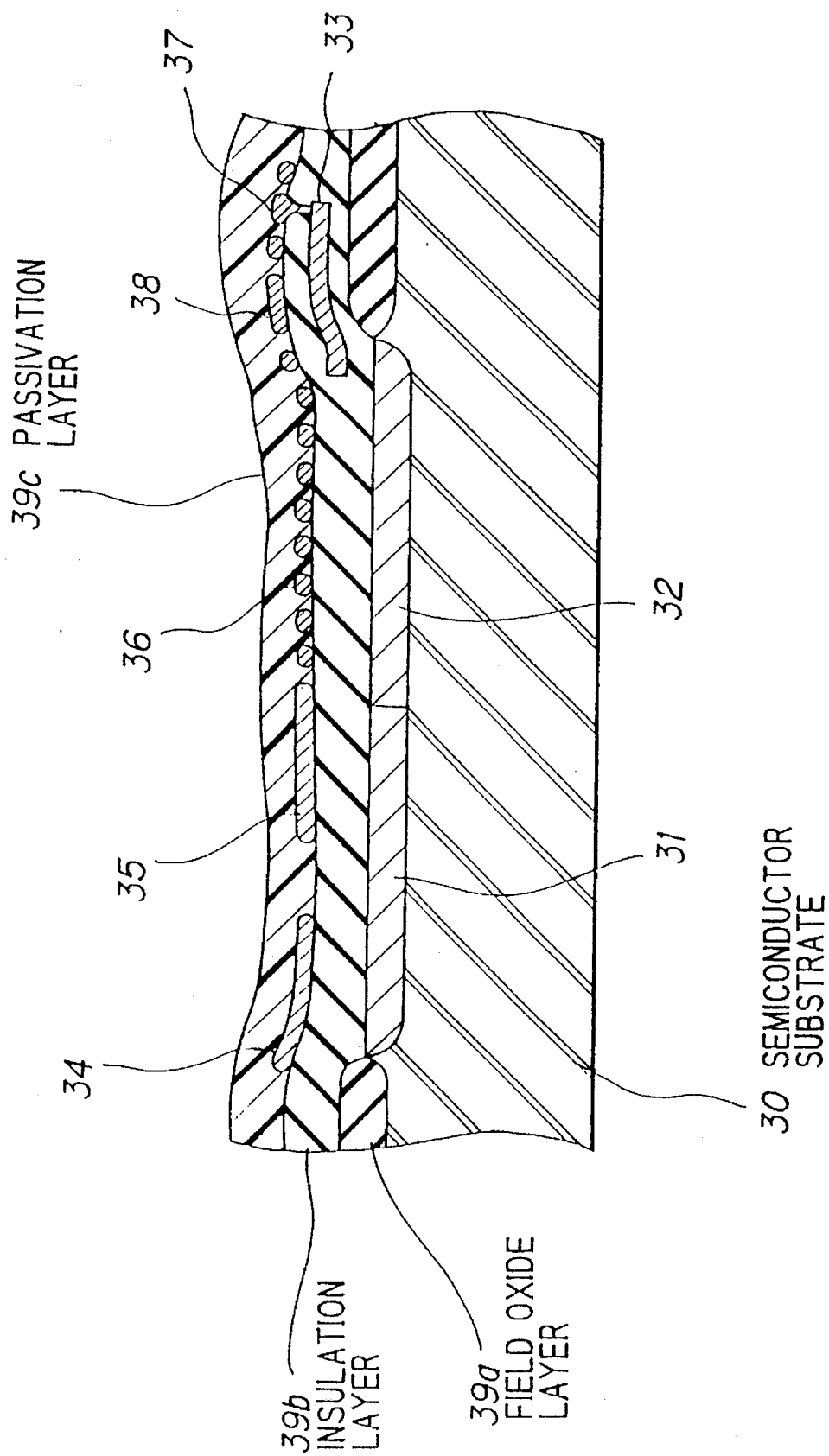
FIG. 6 is cross-sectional view taken on line C—C in FIG. 5.

FIGS. 5 and 6 show a semiconductor device of a second preferred embodiment according to the invention, including a semiconductor substrate 30, first and second device regions 31 and 32 formed on the semiconductor substrate 30, a field oxide layer 39a, an insulation layer 39b, a passivation layer 39c, power source lines 34 and 38, a ground line 35, signal lines 36, connection lines 33, and contact holes 27.

The second preferred embodiment can be realized as a kind of modification of the first preferred embodiment. A feature of the second preferred embodiment is to arrange the additional power source line 38 in the signal lines 36 for providing stable power source to the second device region 32 without using connection lines.

FIGS. 7 and 8 show a semiconductor device of a third preferred embodiment according to the invention, including a semiconductor substrate 40, two first device regions 41a and 41b, two second device regions 42a and 42b, a field oxide layer 50, an insulation layer 52, a passivation layer 54, power source lines 44a, 44b and 48, two ground line 45a and 45b, signal lines 46, connection lines 43, and contact holes 47.

The third preferred embodiment is fabricated by combining two devices according to the second preferred embodiment.

Although the invention has been described with respect to specific embodiments for complete and clear disclosure, the appended claims are not to be thus limited but are to be construed as embodying all modification and alternative constructions that may occur to one skilled in the art which fairly fall within the basic teaching herein set forth.

What is claimed is:

1. A semiconductor device comprising a semiconductor substrate, a first device region in said semiconductor substrate and including a plurality of first semiconductor elements, a second device region in said semiconductor substrate adjacent to said first device region and including a plurality of second semiconductor elements, said first and second device regions having respective parts facing each other, a first power source line running over said semiconductor substrate in a first direction to convey a first power source voltage, said first power source line crossing both of said respective parts of said first and second device regions and supplying said first power source voltage to both at least one of said first semiconductor elements contained in said part of said first device region and at least one of said second semiconductor elements contained in said part of said second device region, a second power source line running over said semiconductor substrate in said first direction in parallel to said first power source line to convey a second power source voltage, said second power source line crossing another part of said first device region and supplying said second power source voltage to at least another one of said first semiconductor elements contained in said other part of said first device region, and at least one signal line running over said semiconductor substrate in parallel to said first and second power source lines and crossing another part of said second device region.

2. The device as claimed in claim 1, further comprising a connection line provided over said semiconductor substrate in a second direction perpendicular to said first direction, said connection line having a first end portion connected to said second power source line, an intermediate portion crossing said first power source line in isolation therefrom and a second end portion connected to at least another one of said second semiconductor elements to thereby supply said second power source voltage to said at least another one of said second semiconductor elements.

3. The device as claimed in claim 2, wherein said device has a multi-level wiring structure including a first-level wiring and a second-level wiring isolated from each other by an insulating film formed therebetween, each of said first and second power source lines and said at least one signal line being in said first-level wiring, and said connection line being in said second-level wiring.

4. A device according to claim 1, and further comprising a passivation layer covering said power and supply lines.

5. A device according to claim 1, wherein said first device region is larger that said second device region.

6. A semiconductor device comprising a semiconductor substrate, a first device region in said semiconductor substrate and including a plurality of first semiconductor elements, a second device region in said semiconductor substrate adjacent to said first device region and including a plurality of second semiconductor elements, said first and second device regions having respective parts facing each other, a first power source line running over said semiconductor substrate and conveying a first power source voltage, said first power source line crossing both of said respective parts of said first and second device regions and supplying said first power source voltage to both at least one of said first semiconductor elements contained in said part of said first device region and at least one of said second semiconductor elements contained in said part of said second device region, a second power source line running over said semiconductor substrate in parallel to said first power source line and conveying a second power source voltage, said second power source line crossing another part of said first device region and supplying said second power source voltage to at least another one of said first semiconductor elements contained in said other part of said first device region, at least one signal line running over said semiconductor substrate in parallel to said first and second power source lines and crossing another part of said second device region, and a third power source line for conveying said second voltage, said third power source line running over said semiconductor substrate in parallel to the first and second power source lines and the at least one signal line, said third power source line also crossing said another part of said second device region and supplying said second power source voltage to at least another one of said second semiconductor elements.

7. A device according to claim 6, and further comprising, at least one connection line running over said semiconductor substrate in a second direction perpendicular to said first direction, said connection line having a first end portion connected to said first power source line, and a second end portion connected to said second device region and supplying said first power source voltage to at least one other of said second semiconductor elements.

8. A device according to claim 7, wherein said at least one signal line is isolated from said at least one connection line.

9. A device according to claim 7, wherein said device has a multi-level wiring structure including a first-level wiring and a second-level wiring isolated from each other by an insulating film formed therebetween, said power lines and said at least one signal line being in said first-level wiring, and said at least one connection line being in said second-level wiring.

10. A device according to claim 6, and further comprising a passivation layer covering said power and supply lines.

11. A device according to claim 6, wherein said first device region is larger than said second device region.

12. A semiconductor device comprising a semiconductor substrate having at least four device regions therein, a first pair of said device regions being adjacent to each other and having respective parts facing each other, a second pair of said device regions being adjacent to each other and having respective parts facing each other, each of said device regions including its own respective plurality of semiconductor elements, each said pair of device regions including a first device region and a second device region, first power source lines running over said semiconductor substrate in a first direction and in parallel to each other, two of said power source lines conveying a first power source voltage and three of said power source lines conveying a second power source voltage, two of the power lines conveying said first source voltage crossing both of said respective parts of said first pair of device regions and supplying said first power source voltage to semiconductor elements contained in said respective parts of said first pair, the other of the power lines conveying said first source voltage crossing both of said respective parts of said second pair of device regions and supplying said first power source voltage to semiconductor elements contained in said respective parts of said second pair, two of said three power source lines conveying said second power source voltage crossing other parts of the first device regions of said pairs, respectively, and supplying said second power source voltage to semiconductor elements in said other parts of said first regions, one of said three power lines conveying said second source voltage running over said substrate between the second device regions of said pairs and supplying said second voltage to at least one other semiconductor element in at least one of said second device regions.

13. A device according to claim 12, and further comprising, at least one connection line running over said semiconductor substrate in a second direction perpendicular to said first direction, said connection line having a first end portion connected to one of said power lines conveying said first power source voltage, and a second end portion connected to one of said second device regions and supplying said first power source voltage to at least another of said second semiconductor elements.

14. A device according to claim 13, and further comprising, at least one signal line running over said semiconductor substrate in parallel to said power lines and crossing one of said second device regions, said at least one signal line being in isolation from said at least one connection line.

15. A device according to claim 14, wherein said device has a multi-level wiring structure including a first-level wiring and a second-level wiring isolated from each other by an insulating film formed therebetween, said power lines and said at least one signal line being in said first-level wiring, and said at least one connection line being in said second-level wiring.

16. A device according to claim 12, and further comprising a passivation layer covering said power lines.

17. A device according to claim 12, wherein said first device regions are larger than said second device regions.

* * * * *

UNITED STATES PATENT AND TRADEMARK OFFICE
CERTIFICATE OF CORRECTION

PATENT NO.   : 5,517,042
DATED        : May 14, 1996
INVENTOR(S)  : Mamoru Kitamura It is certified that error appears in the above-indentified patent and that said Letters Patent is hereby corrected as shown below:

Title page, item [30], under "Foreign Application Priority Data", "5-3146257" should read "5-314625".

Signed and Sealed this

Seventeenth Day of September, 1996

Attest:

BRUCE LEHMAN

*Attesting Officer*     *Commissioner of Patents and Trademarks*